(12) United States Patent
Sigl

(10) Patent No.: US 9,289,844 B2
(45) Date of Patent: Mar. 22, 2016

(54) POWER SUPPLY CHASSIS

(71) Applicant: Illinois Tool Works Inc., Glenview, IL (US)

(72) Inventor: Dennis R. Sigl, Greenville, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 290 days.

(21) Appl. No.: 13/925,235

(22) Filed: Jun. 24, 2013

(65) Prior Publication Data
US 2014/0376186 A1 Dec. 25, 2014

(51) Int. Cl.
*H05K 7/20* (2006.01)
*B23K 9/10* (2006.01)
*B23K 9/32* (2006.01)
*B23K 9/173* (2006.01)

(52) U.S. Cl.
CPC .............. *B23K 9/1043* (2013.01); *B23K 9/173* (2013.01); *B23K 9/32* (2013.01); *H05K 7/20145* (2013.01); *H05K 7/20172* (2013.01)

(58) Field of Classification Search
CPC ............. G06F 1/20; G06F 1/26; G06F 1/181; H05K 7/20172; H05K 7/20727; H05K 7/20909; H05K 7/20136; H05K 7/1492
See application file for complete search history.

(56) References Cited

U.S. PATENT DOCUMENTS

| 3,253,646 | A |   | 5/1966  | Koltuniak |   |
|-----------|---|---|---------|-----------|---|
| 5,642,260 | A |   | 6/1997  | Sigl      |   |
| 5,831,240 | A |   | 11/1998 | Katooka   |   |
| 5,831,847 | A |   | 11/1998 | Love      |   |
| 6,081,423 | A | * | 6/2000  | Griffin   | ........................... 361/688 |
| 6,489,591 | B1 | * | 12/2002 | Achtner   | ..................... 219/130.1 |
| 6,611,189 | B2 |   | 8/2003  | Sigl      |   |
| 6,633,485 | B1 |   | 10/2003 | Sigl et al. |   |
| 6,665,183 | B1 | * | 12/2003 | Shikata et al. | ................ 361/697 |
| 6,794,976 | B2 |   | 9/2004  | Sigl      |   |
| 6,864,777 | B2 |   | 3/2005  | Sigl      |   |
| 7,005,609 | B2 | * | 2/2006  | Andersen et al. | ........... 219/130.1 |
| 7,046,111 | B2 |   | 5/2006  | Sigl      |   |
| 7,265,985 | B2 | * | 9/2007  | Widmayer et al. | ............. 361/721 |
| 7,326,879 | B2 | * | 2/2008  | Andersen et al. | ........... 219/130.1 |
| 7,800,901 | B2 | * | 9/2010  | Borowy et al. | ............... 361/690 |
| 8,188,708 | B2 |   | 5/2012  | Altekruse et al. |   |
| 8,530,789 | B2 | * | 9/2013  | Diekmann et al. | .......... 219/130.1 |
| 2002/0006027 | A1 |   | 1/2002 | Rodriguez |   |
| 2006/0124620 | A1 | * | 6/2006 | Diekmann et al. | .......... 219/130.1 |
| 2007/0247811 | A1 |   | 10/2007 | Ohmi     |   |
| 2014/0374394 | A1 | * | 12/2014 | Sigl     | ............................ 219/130.1 |

FOREIGN PATENT DOCUMENTS

EP 1669152 6/2006

OTHER PUBLICATIONS

International Search Report from PCT application No. PCT/US2014/036891, dated Feb. 5, 2015, 13 pgs.
International Search Report from PCT application No. PCT/US2014/036950, dated Jan. 14, 2015, 14 pgs.

* cited by examiner

Primary Examiner — Gregory Thompson
(74) Attorney, Agent, or Firm — Fletcher Yoder P.C.

(57) ABSTRACT

A welding power supply includes a housing and a one-piece chassis. The one-piece chassis is coupled to the housing and configured to be enclosed within the housing. Moreover, the one-piece chassis is configured to be selectively removable from the housing and the one-piece chassis is configured to have multiple components coupled thereto. The components include one or more transformers, a fan blade, one or more rectifiers, one or more inductors, and control circuitry.

20 Claims, 11 Drawing Sheets

POWER SUPPLY CHASSIS

BACKGROUND

The invention relates generally to power supplies and, more particularly, to a power supply chassis, such as a power supply chassis for an inverter welding power supply.

Welding is a process that has increasingly become utilized in various industries and applications. Such processes may be automated in certain contexts, although a large number of applications continue to exist for manual welding operations. In both cases, such welding operations rely on a variety of types of equipment to ensure the supply of welding consumables (e.g., wire feed, shielding gas, etc.) is provided to the weld in appropriate amounts at the desired time.

Power supplies typically provide welding power for welding operations. Such power supplies include multiple electrical components for converting and/or conditioning an input power to a welding power. For example, welding power supplies may include one or more transformers, inductors, rectifiers, capacitors, and/or control circuitry for converting and/or conditioning an input power. Unfortunately, welding power supply components may occupy large amounts of space and/or may generate a substantial amount of heat. Furthermore, a large number of brackets and/or other mounting structures may be used to manufacture a welding power supply. Accordingly, it may be difficult to efficiently manufacture a compact welding power supply.

BRIEF DESCRIPTION

In one embodiment, a welding power supply includes a housing and a one-piece chassis. The one-piece chassis is coupled to the housing and configured to be enclosed within the housing. Moreover, the one-piece chassis is configured to be selectively removable from the housing and the one-piece chassis is configured to have multiple components coupled thereto. The components include one or more transformers, a fan blade, one or more rectifiers, one or more inductors, and control circuitry.

In another embodiment, a welding power supply includes a housing having a panel and multiple electronic components. The welding power supply also includes a fan configured to direct air across the electronic components and toward the panel. The welding power supply includes a first air flow path across the electronic components and between the fan and the panel, and a second air flow path across the electronic components and between the fan and the panel. The welding power supply also includes a third air flow path across the electronic components and between the fan and the panel.

In a further embodiment, a welding power supply includes a one-piece chassis configured to be coupled to a housing and to be enclosed within the housing. The one-piece chassis includes a fan mount integrally formed thereon for mounting a fan blade. Moreover, the one-piece chassis includes mounting structures for mounting one or more transformers, one or more rectifiers, one or more inductors, and control circuitry.

In another embodiment, a welding power supply includes a one-piece chassis configured to be coupled to a housing and to be enclosed within the housing. The one-piece chassis includes a fan shroud integrally formed thereon and configured to circumscribe a fan blade. Moreover, the one-piece chassis includes mounting structures for mounting one or more transformers, one or more rectifiers, one or more inductors, and control circuitry.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
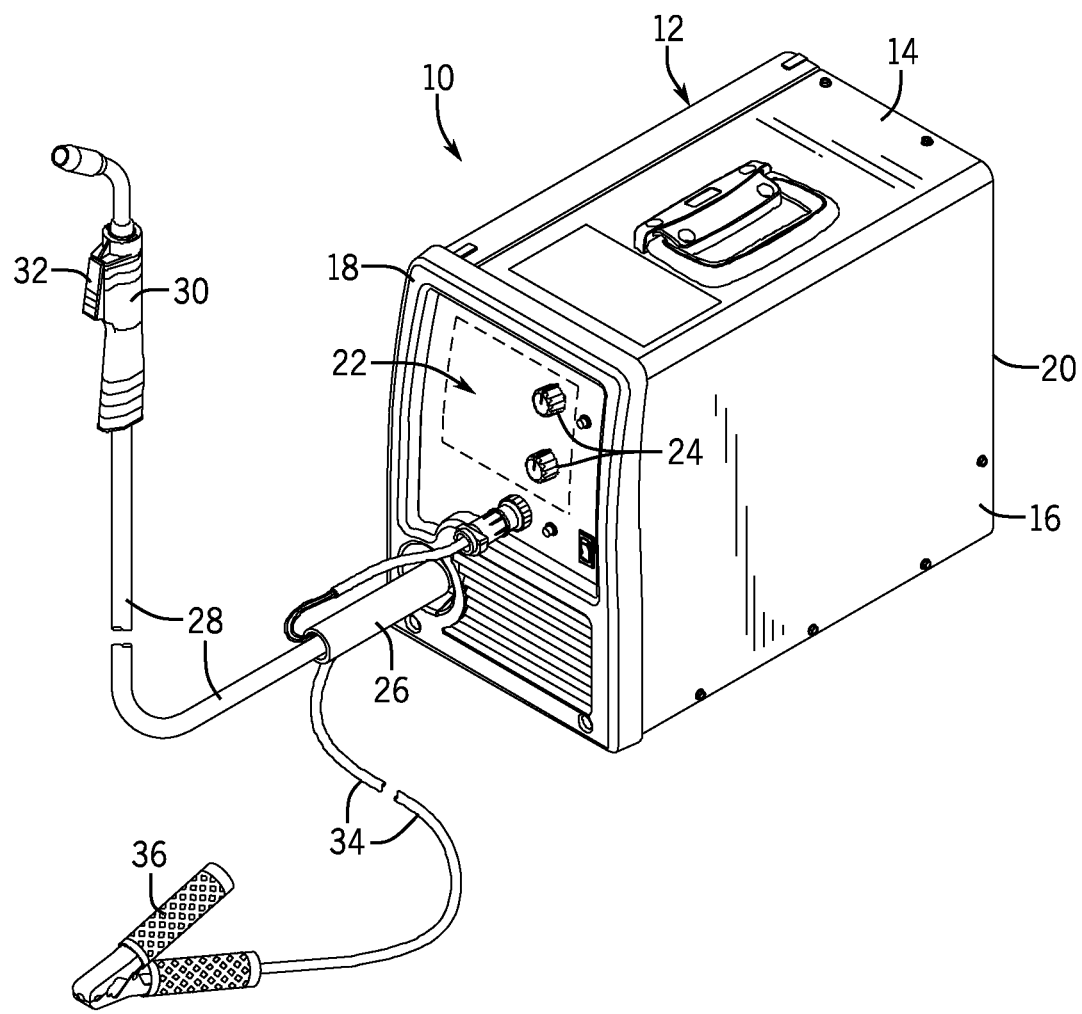
FIG. 1 is a perspective view of an embodiment of a welding power supply.

Turning now to the drawings, FIG. 1 is a perspective view of an exemplary welding power supply 10 configured for use in a gas metal arc welding (GMAW) process or a flux cored arc welding (FCAW) process, for example. In certain embodiments, the welding power supply 10 may be an inverter welding power supply. The welding power supply 10 includes a housing 12 including a top panel 14, a side panel 16, a front panel 18, and a rear panel 20. The top panel 14 may include a handle that facilitates transport of the welding power supply 10 from one location to another by an operator if desired. The front panel 18 includes a control panel 22 configured to allow an operator to set one or more parameters of the welding process, for example, via a user interface 24 (e.g., knobs, buttons, touchscreens, etc.).

In certain embodiments, the welding power supply 10 includes the functionality of a wire feeder (i.e., internal wire feeder). Such embodiments may include a wire drive configured to receive control signals to drive a wire spool. The wire drive feeds wire for the welding operation. In another embodiment, a separate wire feeder may attach to the welding power supply 10 (i.e., external wire feeder). Such a separate wire feeder may also include a wire drive and a wire spool.

A main electrical connector 26 is coupled to the welding power supply 10 via the front panel 18. A cable 28 extends from the main connector 26 to a welding torch 30 configured to be utilized in a welding operation to establish a welding arc. The welding torch 30 includes a trigger 32 that initiates a welding operation and causes welding wire to be supplied to the welding operation by exposing welding wire when pressed. As may be appreciated, pressing the trigger 32 may cause a switch in the trigger 32 to be actuated.

A second cable 34 is attached to the welding power supply 10 through an aperture in the front panel 18 and terminates in a clamp 36 that is configured to clamp to the workpiece during a welding operation to close the circuit between the welding power supply 10, the welding torch 30, and the workpiece. During such an operation, the welding power supply 10 is configured to receive primary power from a primary power supply, such as a power source (e.g., the power grid, engine-generator, etc.), to condition such incoming power, and to output a weld power output appropriate for use in the welding operation. The welding power supply 10 may be manufactured to house electrical components in a compact, cost efficient manner.

Figure 2:
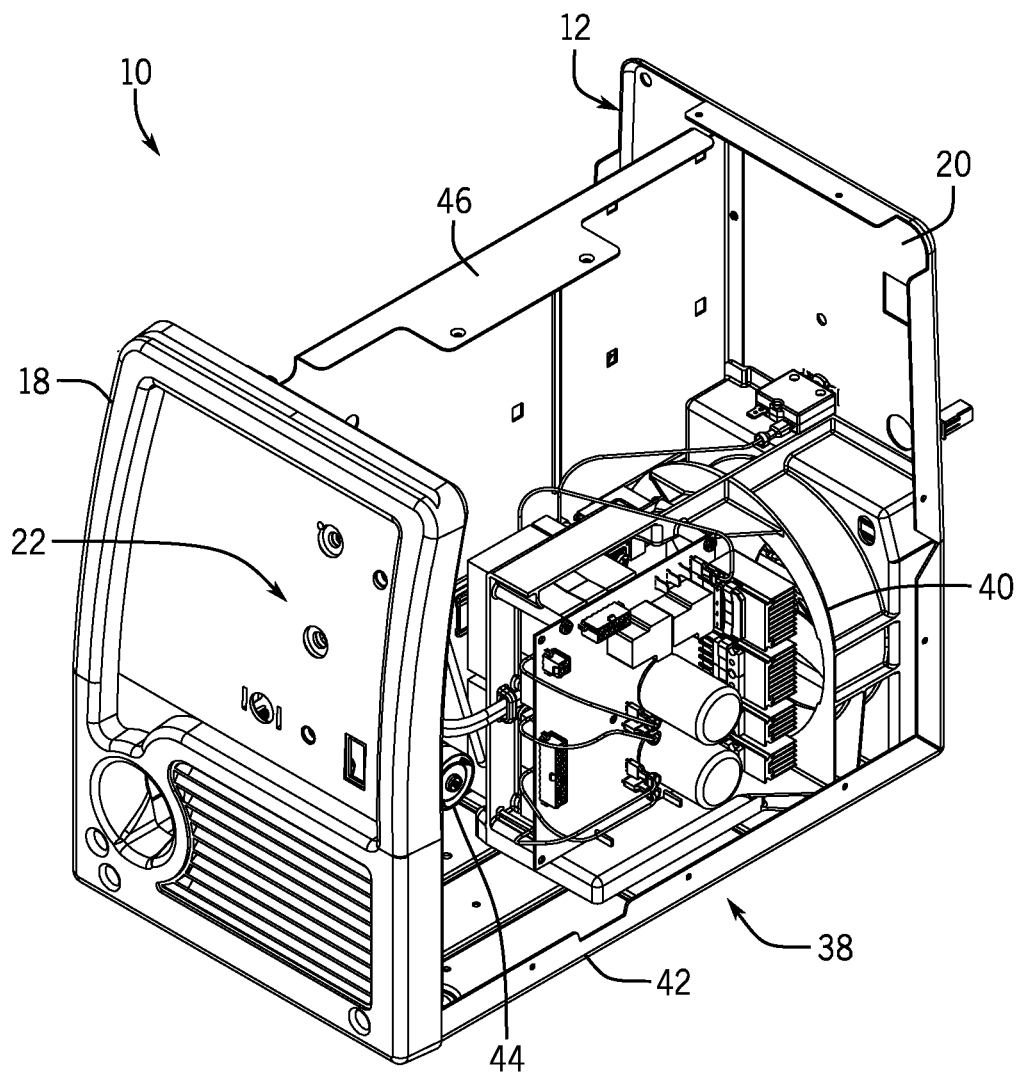
FIG. 2 is a perspective view of the welding power supply of FIG. 1 with portions of a housing removed.

FIG. 2 is a perspective view of the welding power supply 10 of FIG. 1 with portions of the housing 12 removed. The welding power supply 10 includes a chassis assembly 38 having multiple electrical components. The electrical components are mounted to a one-piece chassis 40 to facilitate efficient assembly with a reduced number of mounting structures. In certain embodiments, the one-piece chassis 40 is a single molded part (e.g., formed by injection molding) on which the electrical components (or any components) for the welding power supply 10 are mounted. The one-piece chassis 40 may be formed from any suitable material, such as a polymeric material (e.g., plastic), a metal, and so forth. Moreover, the one-piece chassis 40 may include mounting structures (e.g., bosses) and/or embedded components to facilitate mounting components thereon. The chassis assembly 38 is secured to a base 42 of the housing 12, such as by using fasteners. In certain embodiments, the welding power supply 10 also includes a drive motor 44 for driving a wire spool used to feed welding wire during a welding operation. Moreover, the welding power supply 10 includes a center baffle 46 extending between the front panel 18 and the rear panel 20. The center baffle 46 may provide structural support to the welding power supply 10.

Figure 3:
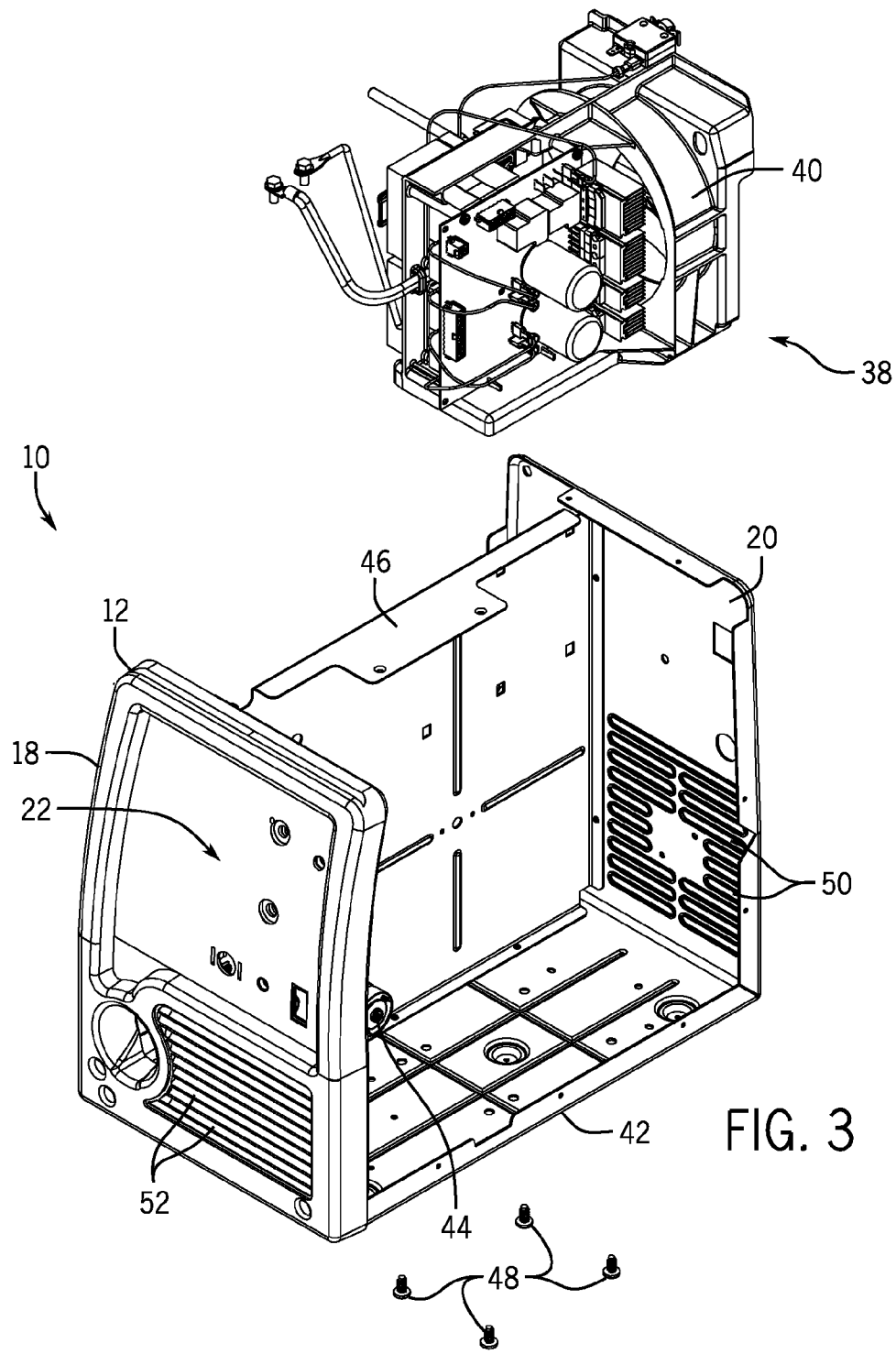
FIG. 3 is an exploded view of the welding power supply of FIG. 2.

FIG. 3 is an exploded view of the welding power supply 10 of FIG. 2. As illustrated, the entire chassis assembly 38 may be removed from the housing 12 of the welding power supply 10. Accordingly, components may be installed and/or removed from the one-piece chassis 40 while the one-piece chassis 40 is removed from the housing 12 of the welding power supply 10, thereby facilitating manufacturing. Furthermore, the entire chassis assembly 38 may be assembled and/or tested before being installed into the housing 12 of the welding power supply 10.

The chassis assembly 38 is attached to the base 42 using fasteners 48. In the illustrated embodiment, four fasteners 48 are used to attach the chassis assembly 38 to the base 42. However, in other embodiments, fewer or more fasteners may be used to attach the chassis assembly 38 to the base 42. By securing the chassis assembly 38 to the base 42 using the fasteners 48 instead of using more complicated mounting arrangements, cost and time associated with manufacturing the welding power supply 10 may be reduced.

The rear panel 20 includes vents 50 and the front panel 18 includes vents 52. The vents 50 and 52 facilitate air flow through the welding power supply 10 for removing heat produced during operation of the welding power supply 10. The vents 50 and 52 are positioned so that the air flow passes between components of the chassis assembly 38 to facilitate removing heat from the components, thereby improving operation of the components.

Figure 4:
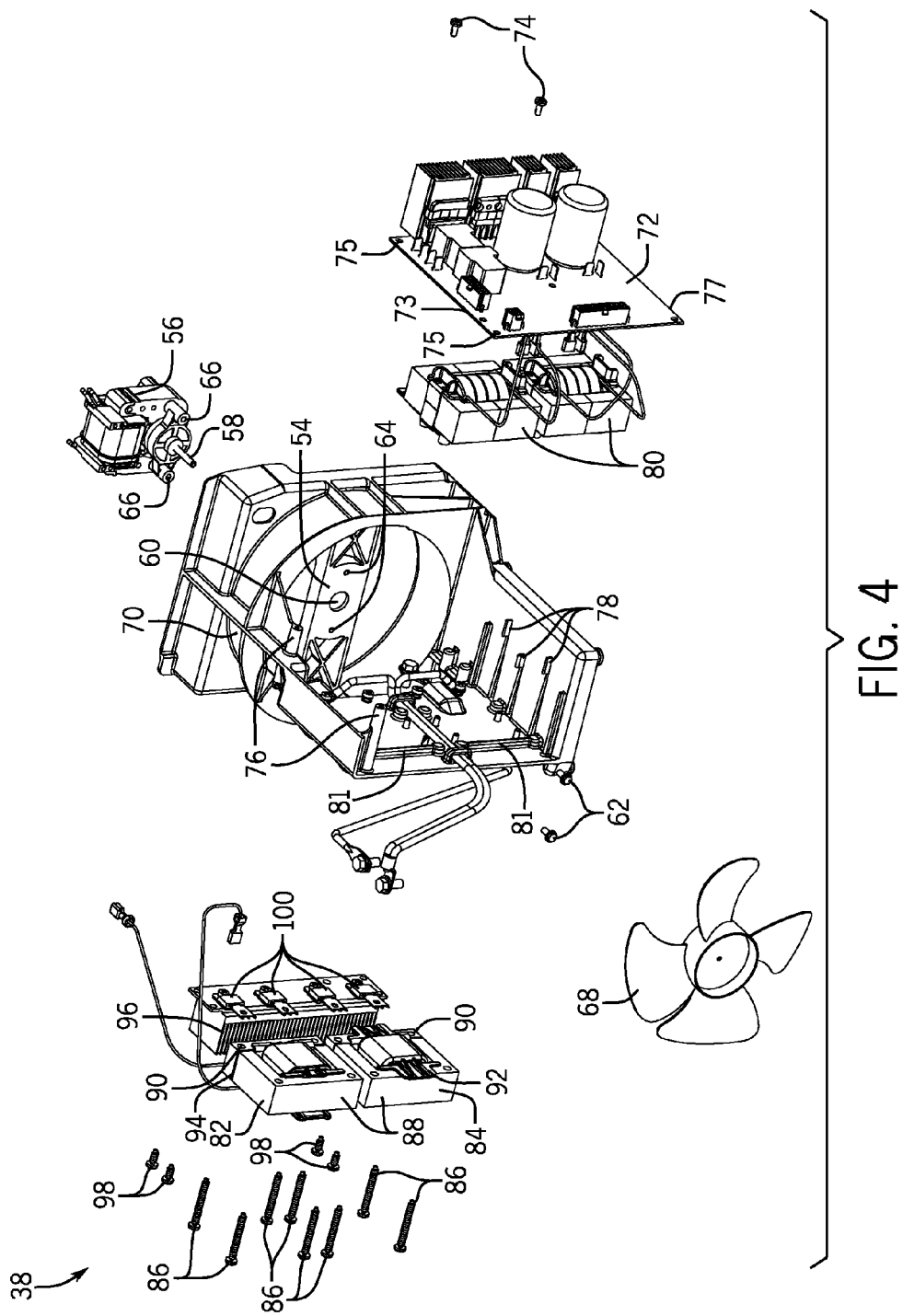
FIG. 4 is an exploded view of an embodiment of a chassis assembly.

FIG. 4 is an exploded view of an embodiment of the chassis assembly 38. As illustrated, the one-piece chassis 40 includes a fan mount 54 to which a fan motor assembly 56 is secured. The fan mount 54 supports the fan motor assembly 56 and positions the fan motor assembly 56 to facilitate proper alignment of a fan blade. During assembly, a shaft 58 of the fan motor assembly 56 is inserted into an opening 60 of the one-piece chassis 40. Furthermore, fasteners 62 are inserted through openings 64 and secured in bosses 66 of the fan motor assembly 56. Moreover, a fan blade 68 (e.g., fan) is attached to the shaft 58, such as by applying force to the fan blade 68 to direct the fan blade 68 along the shaft 58 toward the fan motor assembly 56. When mounted to the shaft 58, the fan blade 68 will be disposed in an interior portion of the one-piece chassis 40, whereas the fan motor assembly 56 is disposed exterior to the one-piece chassis 40.

The one-piece chassis 40 includes a fan shroud 70 integrally formed thereon. The fan shroud 70 circumscribes the fan blade 68 and may include a duct, may direct air towards the fan blade 68, and/or may facilitate improved air flow produced by the fan blade 68 as the fan blade 68 is rotated by the fan motor assembly 56. During operation of the fan motor assembly 56, the fan blade 68 rotates and directs air from the vents 50 in the rear panel 20 toward the vents 52 in the front panel 18. As may be appreciated, in certain embodiments, the fan blade 68 may direct air from the vents 52 in the front panel 18 toward the vents 50 in the rear panel 20. Moreover, cool air (e.g., air that has not been heated by components of the chassis assembly 38) may be drawn by the fan blade 68 across the fan motor assembly 56 to facilitate more efficient operation of the fan motor assembly 56.

By the one-piece chassis 40 including the fan mount 54 and the fan shroud 70, the fan motor assembly 56 and the fan blade 68 may be coupled to the chassis assembly 38 before the chassis assembly 38 is installed into the housing 12 of the welding power supply 10. Accordingly, operation of the fan motor assembly 56 and the fan blade 68 may be tested with other components of the chassis assembly 38, without being installed into the housing 12 of the welding power supply 10.

As may be appreciated, by mounting the fan motor assembly 56 to the fan mount 54 using the bosses 66 on the shaft side of the fan motor assembly 56, movement of the fan motor assembly 56 is reduced as compared to embodiments in which an opposite side of the fan motor assembly 56 is mounted. Accordingly, the effect of movement of the fan motor assembly 56 on the fan blade 68 is reduced when the fan motor assembly 56 is mounted on the shaft side of the fan motor assembly 56. Furthermore, a distance (e.g., clearance) between the fan blade 68 and the shroud 70 may be reduced when the fan blade 68 movement is reduced. Moreover, having the fan mount 54 as part of the one-piece chassis 40 may reduce variations in placement of the fan motor assembly 56, thereby further enabling a reduced distance between the fan blade 68 and the shroud 70. By reducing the distance between the fan blade 68 and the shroud 70, air flow produced by the fan blade 68 may be increased.

As illustrated, the chassis assembly 38 includes a circuit board assembly 72. An upper portion 73 of the circuit board assembly 72 is secured to the one-piece chassis 40 using fasteners 74 inserted through openings 75, and secured in bosses 76. As may be appreciated, the bosses 76 may be formed as part of the one-piece chassis 40. Furthermore, the one-piece chassis 40 includes ribs 78 to secure a lower portion 77 of the circuit board assembly 72. The ribs 78 extend upward from the base of the one-piece chassis 40 forming a lip that blocks lateral movement of the circuit board assembly 72. In certain embodiments, the ribs 78 may apply a force to an end of the lower portion 77 of the circuit board assembly 72 to secure the lower portion 77 to the one-piece chassis 40. By using the ribs 78, only two fasteners 74 are used to secure the circuit board assembly 72 to the one-piece chassis 40, thereby facilitating installation and/or removal of the circuit board assembly 72 with a reduced amount of manufacturing time and/or cost.

Figure 5:
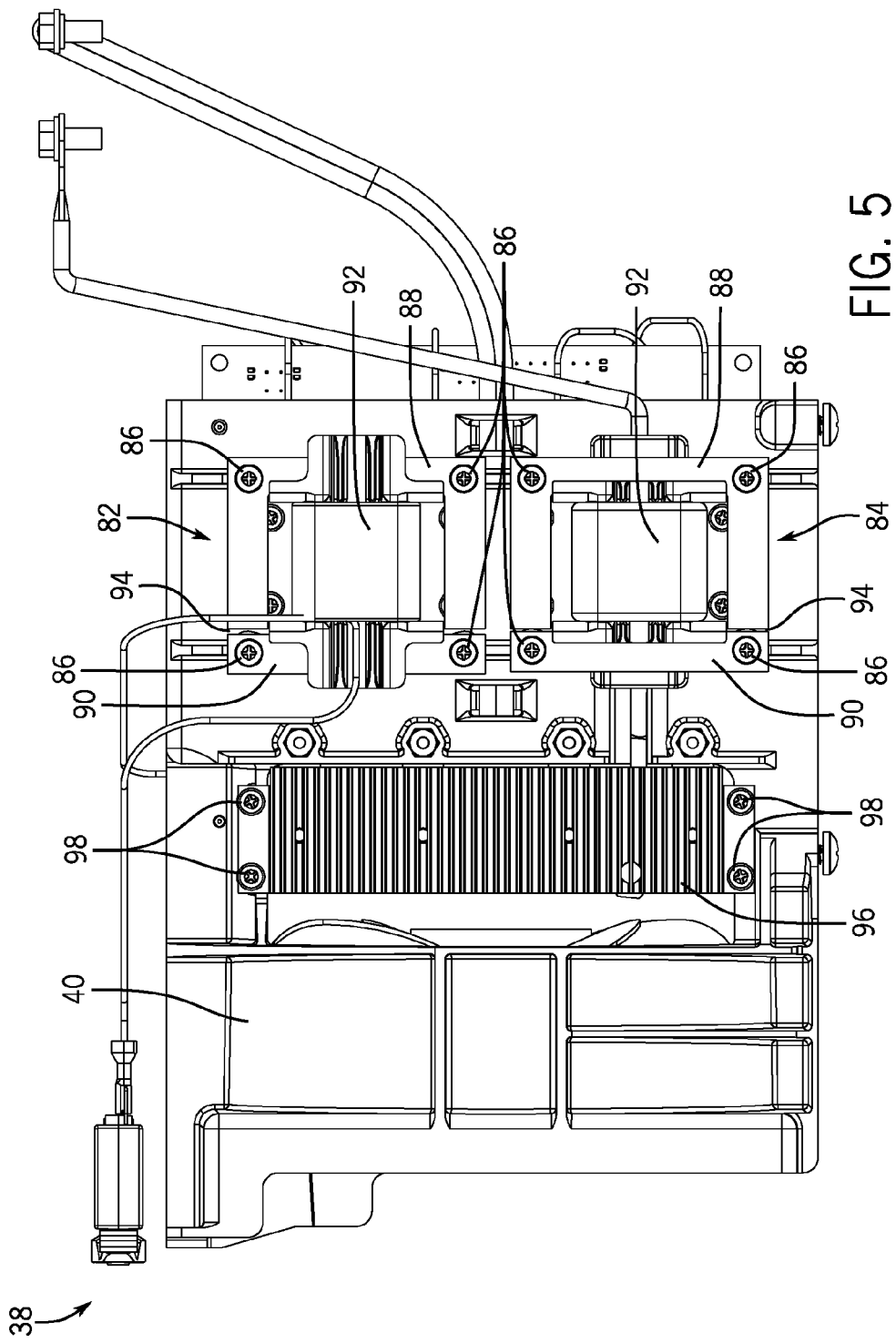
FIG. 5 is a side view of electrical components mounted to a one-piece chassis of the chassis assembly of FIG. 4.
Figure 8:
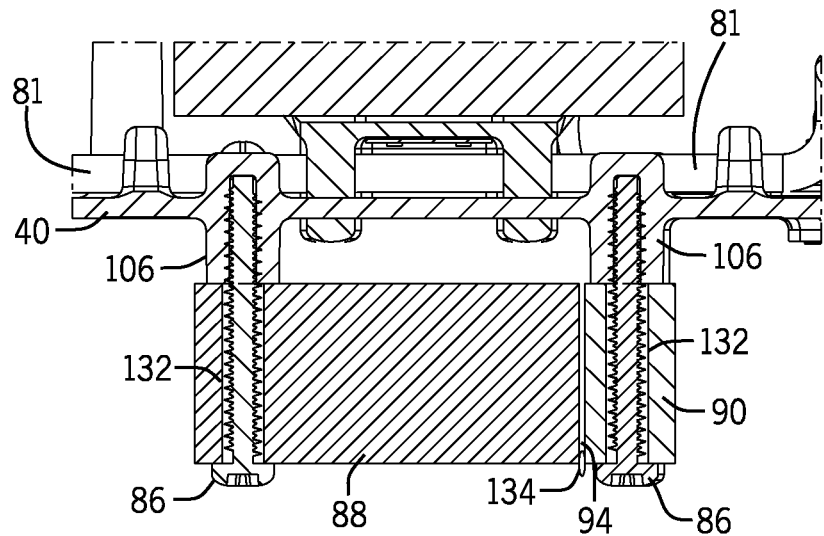
FIG. 8 is a cross-sectional view of an inductor mounted to the one-piece chassis of FIG. 7.
Figure 9:
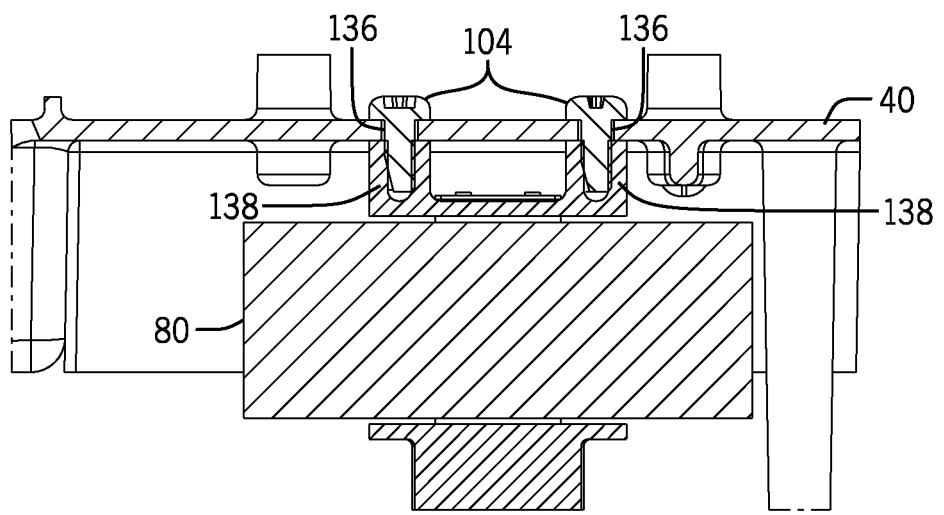
FIG. 9 is a cross-sectional view of a transformer mounted to the one-piece chassis of FIG. 7.

Transformers 80 (e.g., high frequency transformers) may be attached to the one-piece chassis 40 (e.g., between the one-piece chassis 40 and the circuit board assembly 72) using fasteners secured into bosses, as illustrated in FIG. 9. Again, the bosses may be formed as part of the one-piece chassis 40. A rib 81 (e.g., stiffening rib) is formed in the one-piece chassis 40 to provide structural support to counteract a force applied to the one-piece chassis 40 by the transformer 80. In certain embodiments, the rib 81 is formed on the one-piece chassis 40 while the one-piece chassis 40 is molded. Moreover, in some embodiments, more than one rib 81 may be formed as part of the one-piece chassis 40. Furthermore, an input inductor 82 and an output inductor 84 are secured to the one-piece chassis 40 (e.g., on an opposite side of the one-piece chassis 40 from the transformers 80) using fasteners 86, as illustrated in FIGS. 5 and 8. FIG. 5 is a side view of electrical components mounted to the one-piece chassis 40 of the chassis assembly 38 of FIG. 4. In the embodiments illustrated in FIGS. 4 and 5, the input and output inductors 82 and 84 are manufactured using a lamination set having an E portion 88 and an I portion 90. Because the input and output inductors 82 and 84 use the same lamination stack, the same winding and/or welding tooling may be used for both the input and output inductors 82 and 84, thereby reducing manufacturing costs.

Moreover, as illustrated in FIGS. 4 and 5, a bobbin 92 is disposed on the E portion 88. In certain embodiments, the input and output inductors 82 and 84 may use the same type of bobbin 92 (e.g., bobbins 92 formed from the same type of material). Moreover, the bobbin 92 may include an extended piece having a sufficient length to provide insulation to a floating core for the beginning and/or ending lead of each winding, thereby reducing the use of additional insulation. In certain embodiments, a weld bead may be used in a gap 94 between the E portion 88 and the I portion 90 to secure the E portion 88 to the I portion 90 without using a bracket, thereby reducing the number of components in the chassis assembly 38.

An output rectifier heat sink 96 is attached to the one-piece chassis 40 (e.g., on the same side of the one-piece chassis 40 as the inductors 82 and 84) using fasteners 98, as illustrated in FIGS. 4 and 5. Returning to FIG. 4, diodes 100 are attached to the output rectifier heat sink 96 using additional fasteners. By using the one-piece chassis 40, the fan motor assembly 56, the fan blade 68, the circuit board assembly 72, the transformers 80, the input inductor 82, the output inductor 84, and the output rectifier heat sink 96 may all be mounted directly to the one-piece chassis 40 without additional brackets and/or mounting structures. Accordingly, manufacturing complexity, time, and/or cost may be reduced. As may be appreciated, in other embodiments, fewer or more components may be mounted to the one-piece chassis 40.

Figure 6:
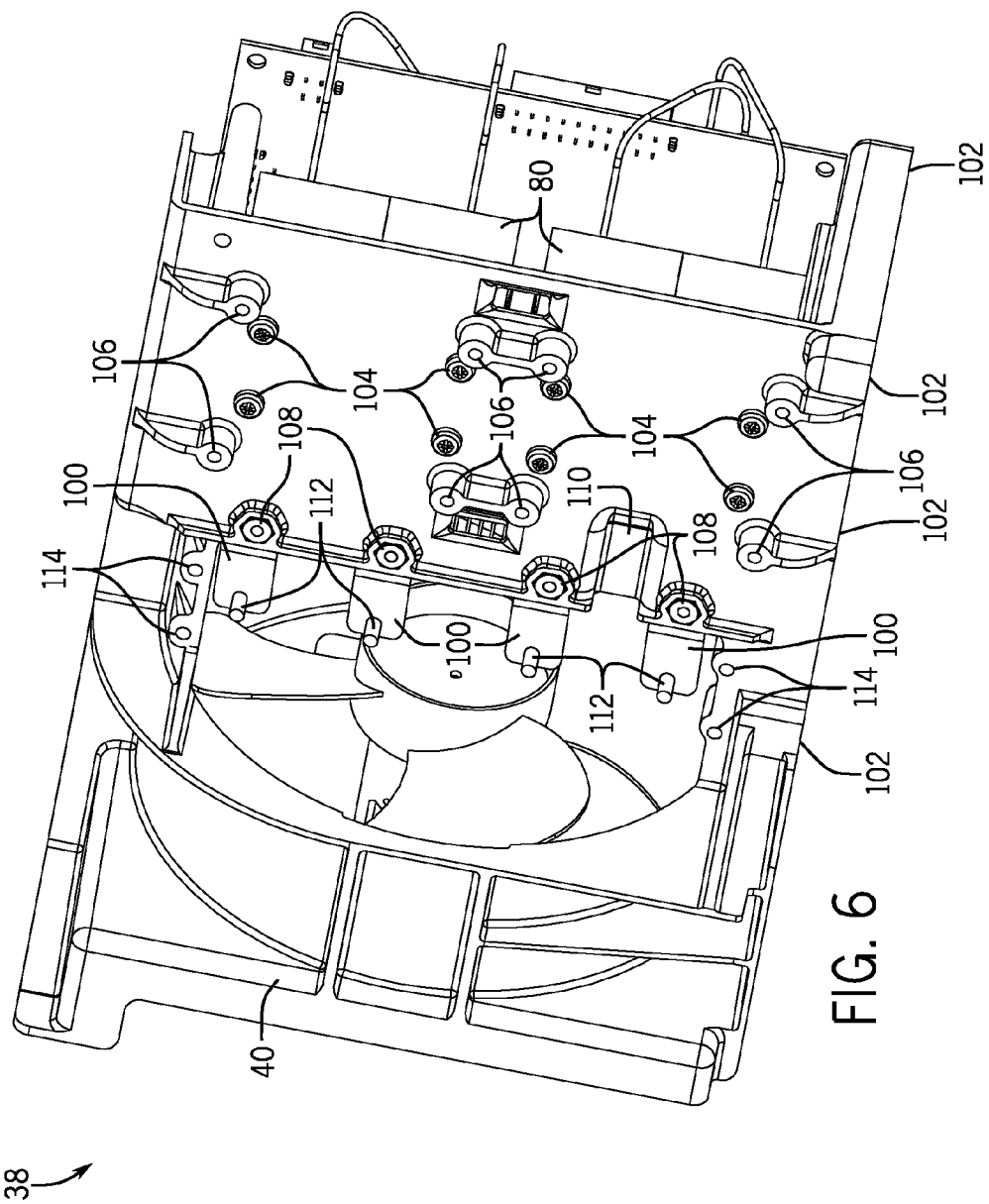
FIG. 6 is a perspective view of electrical components mounted to a one-piece chassis of the chassis assembly of FIG. 4.

FIG. 6 is a perspective view of electrical components mounted to the one-piece chassis 40 of the chassis assembly 38 of FIG. 4. As illustrated, the one-piece chassis 40 includes bosses 102 for mounting the one-piece chassis 40 to the base 42 of the housing 12. Moreover, fasteners 104 are used to attach the transformers 80 to the one-piece chassis 40. Furthermore, in the illustrated embodiment, the one-piece chassis 40 includes bosses 106 for mounting the input and output inductors 82 and 84. The one-piece chassis 40 also includes metallic inserts 108 (e.g., brass inserts) that are integrally formed into the one-piece chassis 40. The metallic inserts 108 facilitate mounting of the diodes 100 to the one-piece chassis 40. In certain embodiments, the metallic inserts 108 may include a threaded opening to facilitate fasteners being secured therein.

The one-piece chassis 40 includes a pocket 110 formed therein to facilitate directing a lead of the output inductor 84 from one side of the one-piece chassis 40 to the opposite side of the one-piece chassis 40. As illustrated, fasteners 112 are used to secure the diodes 100 to the output rectifier heat sink 96. Moreover, the one-piece chassis 40 includes bosses 114 for mounting the output rectifier heat sink 96 to the one-piece chassis 40. As may be appreciated, the fasteners described herein may be any suitable fasteners, such as screws, bolts, pins, etc. Moreover, the fasteners may include additional mounting hardware, such as washers, seals, spacers, etc. Furthermore, to facilitate simplified manufacturing, certain fasteners of the chassis assembly 38 may be the same type, size, and/or shape. By integrally forming mounting structures into the one-piece chassis 40, the one-piece chassis 40 facilitates manufacturing the chassis assembly 38 in a reduced time and/or with reduced cost.

Figure 7:
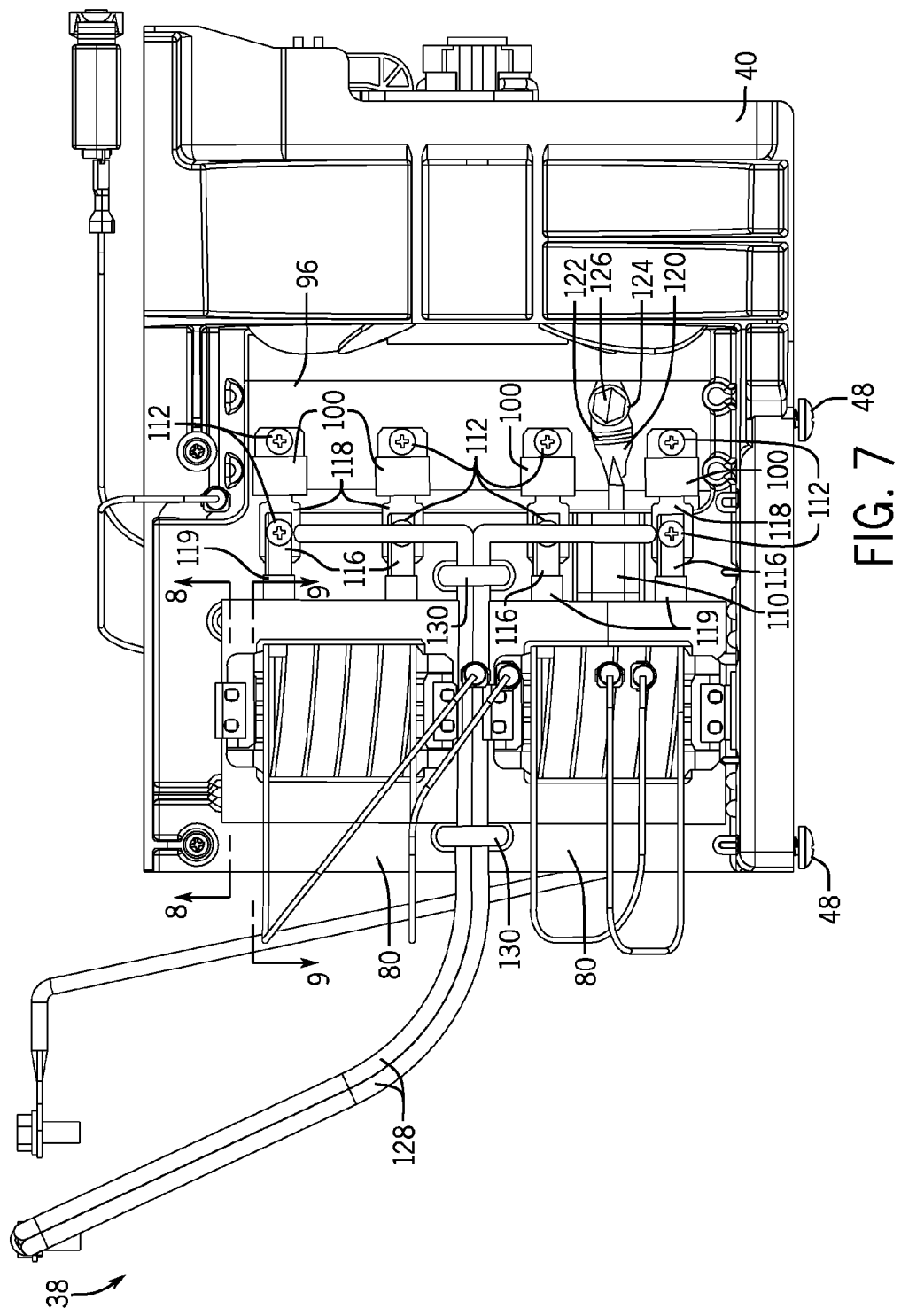
FIG. 7 is a side view of electrical components mounted to a one-piece chassis of the chassis assembly of FIG. 4.

FIG. 7 is a side view of electrical components mounted to the one-piece chassis 40 of the chassis assembly 38 of FIG. 4. The chassis assembly 38 includes a rectifier formed using the four diodes 100. The diodes 100 may be any suitable diode. For example, the diodes 100 may be TO-218 diodes, such as a PowerTab™ diodes manufactured by Vishay Intertechnology, Inc. of Shelton, Conn. As illustrated, the diodes 100 are secured to the output rectifier heat sink 96 using the fasteners 112. Moreover, secondary leads 116 of the transformers 80 extend from the transformers 80 at positions to align with the diodes 100. Accordingly, diode leads 118 may be electrically coupled to the secondary leads 116 without bending of the secondary leads 116. Specifically, the secondary leads 116 are substantially flat (e.g., rectangular) to facilitate each of the fasteners 112 being inserted through one of the secondary leads 116, through one of the diode leads 118, and into one of the metallic inserts 108. The fasteners 112 enable conductivity between the secondary leads 116 and the diode leads 118. Thus, the secondary leads 116 may be electrically coupled to the diode leads 118.

Moreover, in certain embodiments, at least a portion of the secondary leads 116 may include an insulative coat 119 configured to provide a reinforced insulation. For example, in certain embodiments, the secondary leads 116 may be formed from aluminum or copper and the insulative coat 119 may be an insulative tape, such as Nomex® paper type 410 manufactured by DuPont™ of Houston, Tex. As may be appreciated, openings in the secondary leads 116 for inserting the fasteners 112 may be formed before insertion of the fasteners 112. For example, holes may be punched in a flat portion of the secondary leads 116. Therefore, by forming openings in the secondary leads 116 to electrically couple the secondary leads 116 to the diode leads 118, no additional leads are crimped onto the ends of the secondary leads 116, thereby reducing manufacturing time and/or cost. Furthermore, the diode leads 118 are not bent and/or trimmed during assembly, further reducing manufacturing time.

An output inductor lead 120 extends from the output inductor 84 and through the pocket 110 to facilitate coupling the output inductor lead 120 to the output rectifier heat sink 96. The output inductor lead 120 includes a flat portion 122 that may also include a stepped portion, as illustrated. Moreover, the flat portion 122 includes an opening 124 to enable a fastener 126 to electrically couple the output inductor lead 120 to the rectifier heat sink 96. As may be appreciated, the flat portion 122 may be formed using any suitable technique, such as by compressing an end of the output inductor lead 120. Furthermore, the opening 124 may be formed before insertion of the fastener 126. In certain embodiments, the fastener 126 may be a self-tapping screw. Accordingly, by forming the flat portion 122 with the opening 124 to electrically couple the output inductor lead 120 to the rectifier heat sink 96, no additional lead is crimped onto the end of the output inductor lead 120, thereby reducing manufacturing time and/or cost.

The chassis assembly 38 includes output leads 128 for providing output current. The output leads 128 may be formed from any suitable wire sizes, such as 6, 8, 10, or 12 gauge wire. For example, in certain embodiments, the output leads 128 may be 10 gauge wires. Guides 130 may be formed as part of the one-piece chassis 40 to facilitate routing and/or securing the output leads 128. Accordingly, the guides 130 may direct the output leads 128 such that the output leads 128 do not interfere with other components. As illustrated, the output leads 128 may be electrically coupled to two of the diodes 100.

FIG. 8 is a cross-sectional view of an inductor (e.g., one of the inductors 82 and 84) mounted to the one-piece chassis 40 of FIG. 7. As illustrated, the fasteners 86 are inserted through openings 132 in the E portion 88 and the I portion 90. The fasteners 86 secure the E portion 88 and the I portion 90 to the bosses 106 in the one-piece chassis 40. Moreover, a weld bead 134 couples the E portion 88 to the I portion 90, thereby eliminating the use of a bracket for mounting the E portion 88 and the I portion 90 to the one-piece chassis 40. FIG. 9 is a cross-sectional view of the transformer 80 mounted to the one-piece chassis 40 of FIG. 7. As illustrated, the fasteners 104 are inserted into openings 136 in the one-piece chassis 40. The fasteners 104 are secured to bosses 138 of the transformer 80, such as by screwing the fasteners 104 into threads of the bosses 138.

Figure 10:
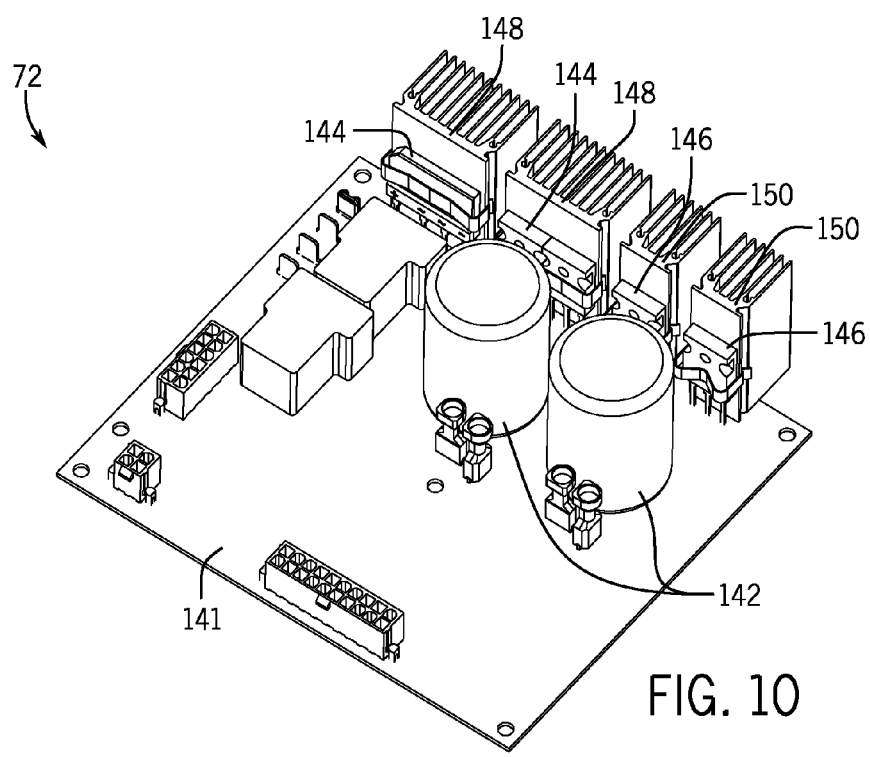
FIG. 10 is a perspective view of an embodiment of a circuit board assembly.

FIG. 10 is a perspective view of an embodiment of the circuit board assembly 72. The circuit board assembly 72 includes multiple electrical components (e.g., control circuitry) mounted on a circuit board 141. In certain embodiments, the circuit board 141 may be a printed circuit board (PCB). As illustrated, capacitors 142 are coupled to the circuit board 141. Moreover, two of each of semiconductors 144 and 146 are coupled to the circuit board 141. The semiconductors 144 and 146 are different sizes. Accordingly, the semiconductors 144 and 146 have respective sized heat sinks 148 and 150. As may be appreciated, the semiconductors 144 and 146 are cooled by transferring heat to the heat sinks 148 and 150. In certain embodiments, the heat sinks 148 and 150 may be positioned adjacent to a fan to facilitate cooling of the heat sinks 148 and 150 (e.g., transferring heat from the heat sinks 148 and 150 to cool air).

Figure 11:
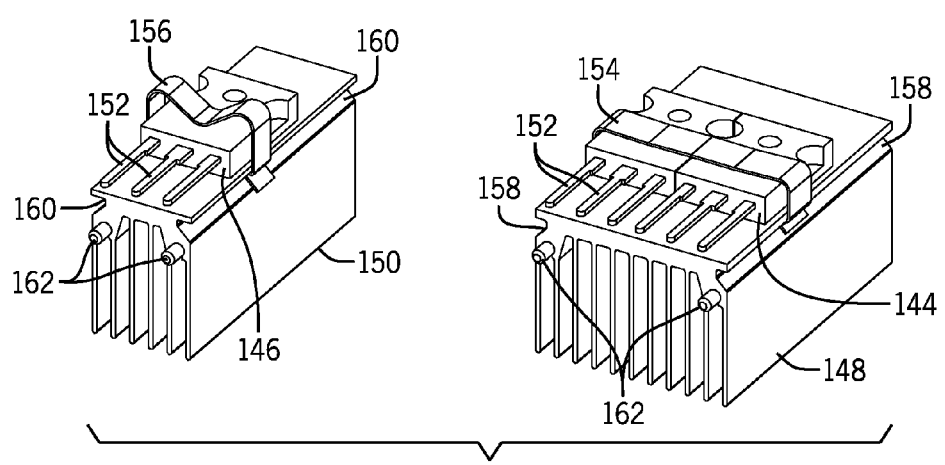
FIG. 11 is a perspective view of an embodiment of semiconductors having heat sinks mounted thereon.

FIG. 11 is a perspective view of an embodiment of the semiconductors 144 and 146 having the heat sinks 148 and 150 mounted thereon. As illustrated, the semiconductors 144 and 146 include pins 152 extending therefrom. The pins 152 extend adjacent (e.g., substantially parallel) to the heat sinks 148 and 150. A clip 154 couples the heat sink 148 to the semiconductor device 144, while a clip 156 couples the heat sink 150 to the semiconductor device 146. Specifically, the clip 154 is secured in slots 158 that may be extruded into the heat sink 148, and the clip 156 is secured in slots 160 that may be extruded into the heat sink 150. In the illustrated embodiment, the heat sinks 148 and 150 include pins 162 for positioning the heat sinks 148 and 150 on the circuit board 141. In certain embodiments, the pins 162 may be inserted into extruded portions of the heat sinks 148 and 150. As may be appreciated, in certain embodiments, the size of the heat sinks 148 and 150 may be determined by the size of the respective semiconductors 144 and 146.

Figure 12:
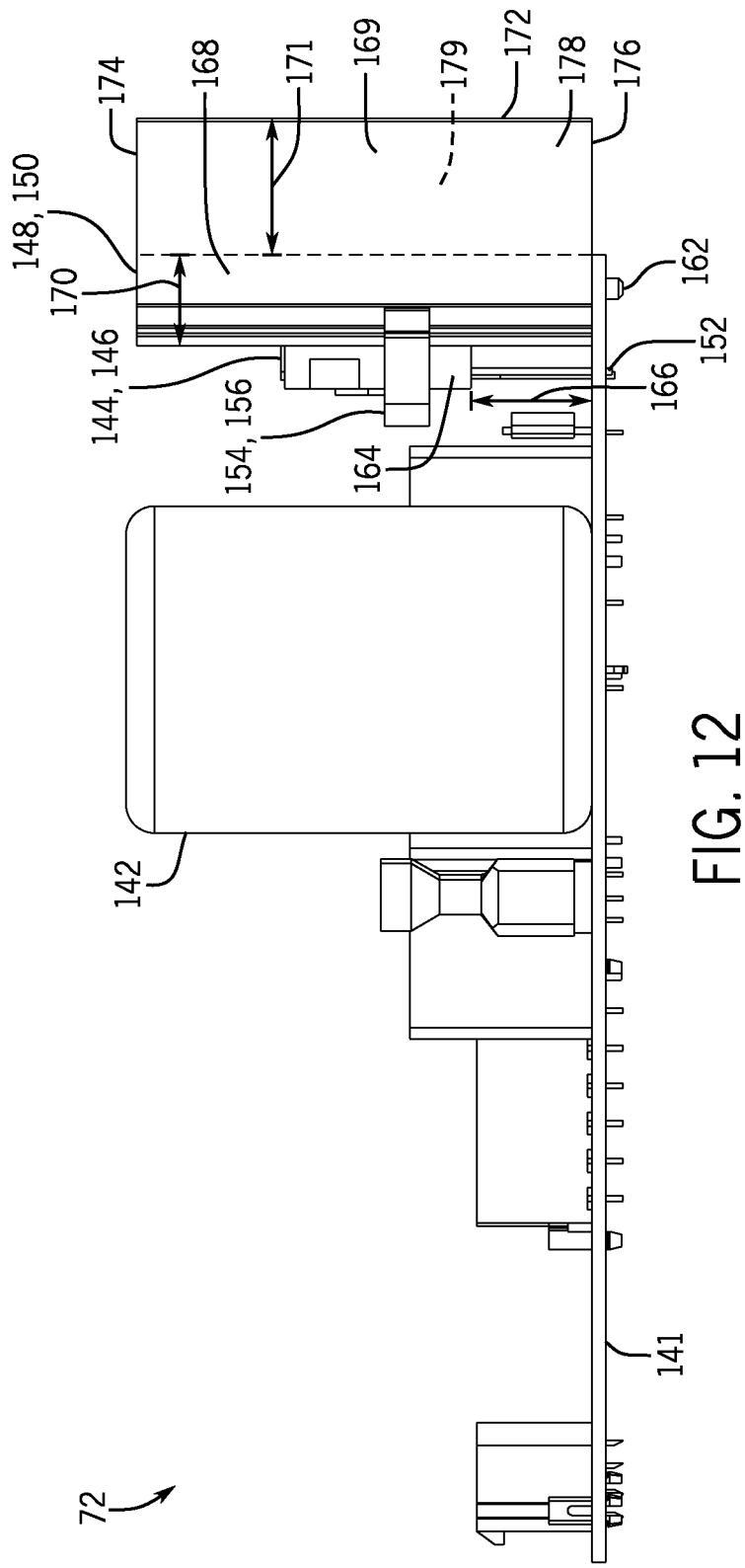
FIG. 12 is a side view of the circuit board assembly of FIG. 10.

FIG. 12 is a side view of the circuit board assembly 72 of FIG. 10. In the illustrated embodiment, the heat sinks 148 and 150 are approximately the same height as the capacitors 142. In addition, the heat sinks 148 and 150 have a substantially rectangular shape. Moreover, the pins 152 of the semiconductors 144 and 146 extend from a body 164 of the semiconductors 144 and 146 to the circuit board 141 a distance 166. Furthermore, the heat sinks 148 and 150 extend parallel to the semiconductors 144 and 146 for approximately the same distance 166. For example, in certain embodiments, the heat sinks 148 and 150 may extend parallel to the semiconductors 144 and 146 for approximately 85 percent to 95 percent, 90 percent to 100 percent, or 95 to 100 percent of the distance 166. The heat sinks 148 and 150 are mounted to the body 164 of the semiconductors 144 and 146 so that the pins 152 of the semiconductors 144 and 146 are not trimmed during manufacturing, thereby reducing manufacturing cost and time. As illustrated, the pins 162 of the heat sinks 148 and 150 extend into the circuit board 141. Accordingly, the circuit board 141 provides support to the heat sinks 148 and 150. In the illustrated embodiment, the heat sinks 148 and 150 are attached to the semiconductors 144 and 146 near a central portion of the heat sinks 148 and 150. Therefore, heat produced by the semiconductors 144 and 146 may quickly dissipate into the heat sinks 148 and 150.

The heat sinks 148 and 150 each include a first portion 168 extending directly over the circuit board 141 in a direction orthogonal to the circuit board 141 and a second portion 169 that is not aligned directly over the circuit board 141 in the direction orthogonal to the circuit board 141. In other words, the second portion 169 of the heat sinks 148 and 150 overhang an edge of the circuit board 141. As illustrated, the second portion 169 is larger than the first portion 168 such that a larger portion of the heat sinks 148 and 150 is not disposed directly over the circuit board 141 (e.g., a larger portion of each of the heat sinks 148 and 150 hangs over an edge of the circuit board 141). Moreover, a width 170 of the heat sinks 148 and 150 that is disposed directly over the circuit board 141 is smaller than a width 171 of the heat sinks 148 and 150 that is not disposed directly over the circuit board 141. By positioning the second portion 169 so that it is not disposed directly over the circuit board 141, space on the circuit board 141 may be conserved for other electronic components. Moreover, the heat sinks 148 and 150 may be positioned adjacent to the fan blade 68 so that air is blown directly onto the heat sinks 148 and 150. Accordingly, a front (fan) side 172 of the heat sinks 148 and 150 may have air blown directly thereon (e.g., via impingement air flow).

In the illustrated embodiment, the air blown by the fan blade 68 may also travel across sides 174, 176, 178, and 179 of the heat sinks 148 and 150. Therefore, the heat sinks 148 and 150 may be formed to be smaller than heat sinks that are not positioned to receive air directed toward one or more sides of the heat sinks. For example, a baffle size of the heat sinks 148 and 150 may be reduced and/or fin sizes of the heat sinks 148 and 150 may be reduced. As may be appreciated, a smaller baffle size and/or smaller fin sizes facilitates manufacturing the heat sinks 148 and 150 with reduced cost and/or facilitates easier extruding of the heat sinks 148 and 150. Furthermore, the circuit board 141 may also be smaller than in other embodiments because less space of the circuit board 141 is occupied by the heat sinks 148 and 150.

Figure 13:
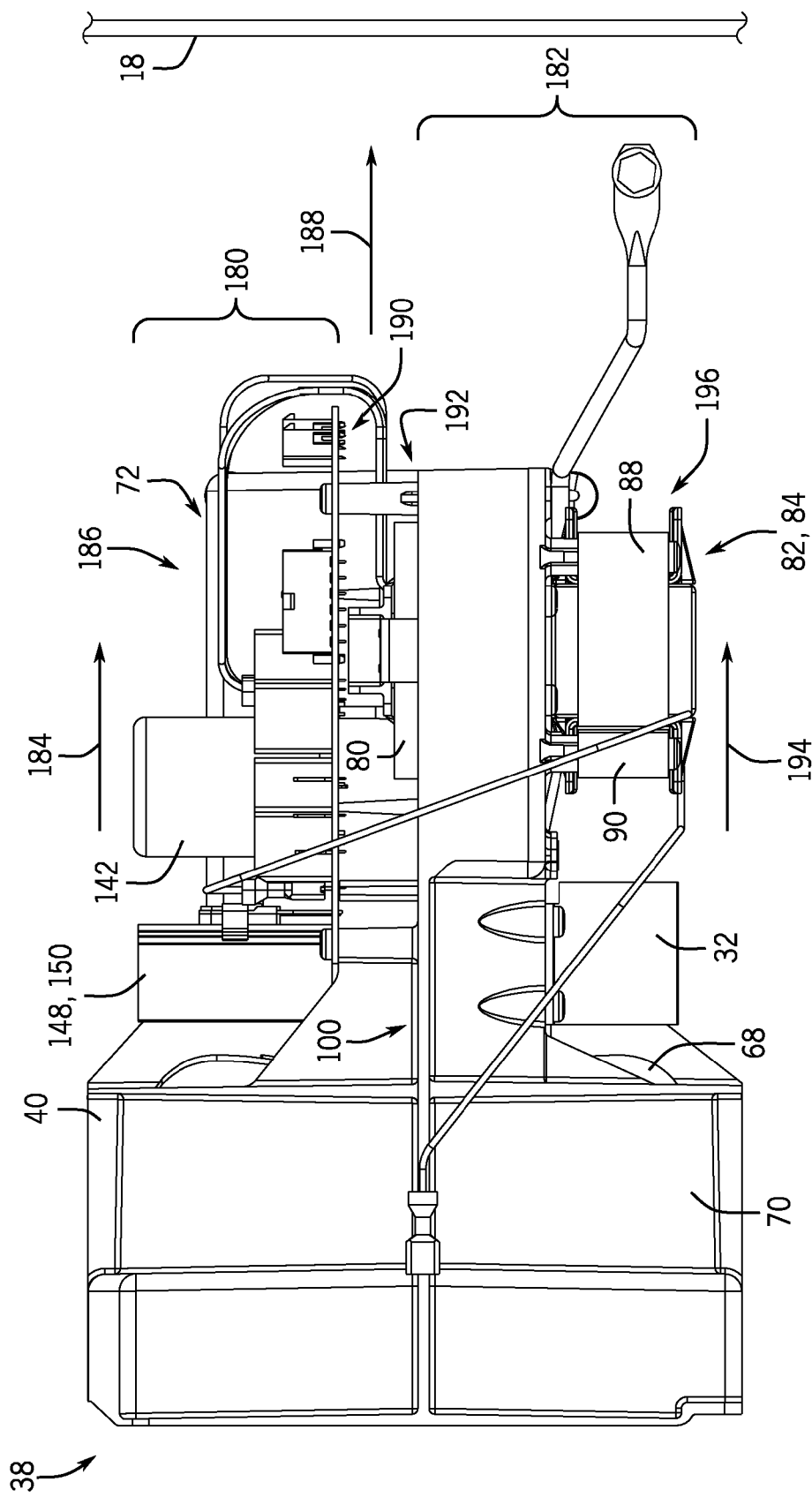
FIG. 13 is a top view of the chassis assembly of FIG. 4, illustrating multiple air flow paths through the chassis assembly.

FIG. 13 is a top view of the chassis assembly 38 of FIG. 4, illustrating multiple air flow paths through the chassis assembly 38 that direct air from the fan blade 68 toward the front panel 18 of the housing 12 of the welding power supply 10. In the illustrated embodiment, various portions of the chassis assembly 38 may form layers that separate the air directed from the fan blade 68 into three distinct air flow paths so that air from a substantial amount of the fan blade 68 may be used. For example, certain components and/or portions of the one-piece chassis 40 may form a first layer 180 (e.g., first baffle), and other components and/or portions of the one-piece chassis 40 may form a second layer 182 (e.g., second baffle).

A first air flow path 184 flows over a top side 186 of the first layer 180, and between the fan blade 68 and the front panel 18. In certain embodiments, the top side 186 includes the heat sinks 148 and 150, the capacitors 142, and other components mounted to the circuit board 72. Moreover, a second air flow path 188 flows between a bottom side 190 of the first layer 180 and a top side 192 of the second layer 182, and between the fan blade 68 and the front panel 18. For example, the second air flow path 188 may include the transformers 80 and the diodes 100. Furthermore, a third air flow path 194 flows over a bottom side 196 of the second layer 182, and between the fan blade 68 and the front panel 18. In certain embodiments, the bottom side 196 includes the output rectifier heat sink 96, the input inductor 82, and the output inductor 84. As illustrated, in certain embodiments, the first air flow path 184, the second air flow path 188, and the third air flow path 194 may all be substantially parallel to one another. For example, the first air flow path 184, the second air flow path 188, and the third air flow path 194 may be within approximately 0 to 10 degrees of being parallel to one another. By using the three distinct air flow paths, the components along each air flow path may receive separate cooling air streams, thereby enabling a compact arrangement of the components.

As described herein, the one-piece chassis 40 may be used in the welding power supply 10 to reduce manufacturing time and/or cost. The one-piece chassis 40 may be formed by injection molding and may include bosses and/or mounting structures that facilitate quickly installing and/or removing components of the chassis assembly 38. The one-piece chassis 40 may include the fan mount 54 for mounting the fan motor assembly 56 and the fan blade 68. Moreover, the one-piece chassis 40 may include the fan shroud 70 to improve air stream output from the fan blade 68. Furthermore, the chassis assembly 38 may have components arranged thereon to form three separate air flow paths through the chassis assembly 38, thereby improving cooling efficiency of the chassis assembly 38. Accordingly, the chassis assembly 38 may be compact to enable a size of the welding power supply 10 to be reduced.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A welding power supply comprising:
   a housing; and
   a one-piece chassis coupled to the housing and configured to be enclosed within the housing, wherein the one-piece chassis is configured to be selectively removable from the housing, wherein the one-piece chassis is configured to have a plurality of components coupled thereto, and the plurality of components comprise one or more transformers, a fan blade, one or more rectifiers, one or more inductors, and control circuitry, and wherein the one-piece chassis comprises a fan shroud configured to direct air toward the fan blade.

2. The welding power supply of claim 1, wherein the fan shroud is configured to circumscribe the fan blade, and the welding power supply comprise a fan mount configured to facilitate mounting of the fan blade directly to the one-piece chassis.

3. The welding power supply of claim 1, wherein the one-piece chassis is coupled to the housing using a plurality of fasteners.

4. The welding power supply of claim 3, wherein the plurality of fasteners comprises four fasteners.

5. The welding power supply of claim 1, wherein the one-piece chassis comprises plastic.

6. The welding power supply of claim 1, wherein the one-piece chassis comprises a plurality of mounting bosses for coupling the one-piece chassis to the housing.

7. A welding power supply comprising:
   a one-piece chassis configured to be coupled to a housing and to be enclosed within the housing, wherein the one-piece chassis comprises a fan mount integrally formed thereon for mounting a fan blade, wherein the one-piece chassis comprises mounting structures for mounting one or more transformers, one or more rectifiers, one or more inductors, and control circuitry, and wherein the one-piece chassis comprises a fan shroud configured to direct air toward the fan blade.

8. The welding power supply of claim 7, wherein the one-piece chassis comprises plastic.

9. The welding power supply of claim 7, wherein the one-piece chassis is manufactured via injection molding.

10. The welding power supply of claim 7, comprising the fan blade and fan motor coupled to the fan mount.

11. A welding power supply comprising:
    a one-piece chassis configured to be coupled to a housing and to be enclosed within the housing, wherein the one-piece chassis comprises a fan shroud integrally formed thereon and configured to circumscribe a fan blade, and wherein the one-piece chassis comprises mounting structures for mounting one or more transformers, one or more rectifiers, one or more inductors, and control circuitry.

12. The welding power supply of claim 11, wherein the one-piece chassis comprises a polymeric material.

13. The welding power supply of claim 11, wherein the one-piece chassis comprises a fan mount to enable mounting of a fan directly to the one-piece chassis.

14. The welding power supply of claim 11, comprising the fan blade, the one or more transformers, the one or more rectifiers, the one or more inductors, and the control circuitry mounted to the one-piece chassis.

15. A welding power supply comprising:
    a housing; and
    a one-piece chassis coupled to the housing and configured to be enclosed within the housing, wherein the one-piece chassis is configured to be selectively removable from the housing, wherein the one-piece chassis is configured to have a plurality of components coupled thereto, and the plurality of components comprise one or more transformers, a fan blade, one or more rectifiers, one or more inductors, and control circuitry, and wherein the one-piece chassis comprises a fan shroud configured to circumscribe the fan blade, and a fan mount configured to facilitate mounting of the fan blade directly to the one-piece chassis.

16. The welding power supply of claim 1, wherein the one-piece chassis is coupled to the housing using a plurality of fasteners.

17. The welding power supply of claim 16, wherein the plurality of fasteners comprises four fasteners.

18. The welding power supply of claim 1, wherein the one-piece chassis comprises plastic.

19. The welding power supply of claim 1, wherein the one-piece chassis comprises a plurality of mounting bosses for coupling the one-piece chassis to the housing.

20. The welding power supply of claim 15, wherein the fan shroud is configured to direct air toward the fan blade.

* * * * *